United States Patent
Lee et al.

(10) Patent No.: US 6,775,058 B2
(45) Date of Patent: Aug. 10, 2004

(54) WIDE BAND OPTICAL AMPLIFIER

(75) Inventors: Chang Hee Lee, Daejon (KR); Hyun Deok Kim, Daegu (KR); Jeong Hun Shin, Daegu (KR); Yun Hee Cho, Seoul (KR)

(73) Assignee: Korea Advanced Institute of Science and Technology, Daejon (KR)

( * ) Notice: Subject to any disclaimer, the term of this patent is extended or adjusted under 35 U.S.C. 154(b) by 137 days.

(21) Appl. No.: 10/123,663

(22) Filed: Apr. 16, 2002

(65) Prior Publication Data

US 2002/0149843 A1 Oct. 17, 2002

(30) Foreign Application Priority Data

Apr. 16, 2001 (KR) .................................. 2001-0020121

(51) Int. Cl.[7] .............................................. H01S 3/00
(52) U.S. Cl. .................................................... 359/349
(58) Field of Search ............................. 359/349, 337.1, 359/337.4

(56) References Cited

U.S. PATENT DOCUMENTS

| | | | | |
|---|---|---|---|---|
| 6,049,417 A | * | 4/2000 | Srivastava et al. | 359/337.4 |
| 6,396,623 B1 | * | 5/2002 | Wysocki et al. | 359/337.4 |
| 6,480,328 B2 | * | 11/2002 | Shimojoh | 359/341.1 |
| 6,483,636 B1 | * | 11/2002 | Sugaya et al. | 359/349 |
| 6,563,630 B1 | * | 5/2003 | Jacob et al. | 359/341.2 |

OTHER PUBLICATIONS

Article entitled "Ultra–wideband, long distrance WDM demonstration of 1 Tbit/s (50×20 Gbit/s), 600km transmission using 1550 and 1580 nm wavelenghth bands", by S. Aisawa, T. Sakamoto, M. Fukui, J. Kani, M. Jinno and K. Oguchi, Electronics Letters periodical, May 28, 1998, vol. 34, No. 11, pp. 1127–1129.

Article entitled "Cladding–surrounding interface insensitive long–period grating", by B.H. Lee and J. Nishii; Electronics Letters periodical, May 28, 1998, vol. 34, No. 11, pp. 1129–1130.

* cited by examiner

*Primary Examiner*—Thomas G. Black
*Assistant Examiner*—Deandra M. Hughes
(74) *Attorney, Agent, or Firm*—Harness, Dickey & Pierce, P.L.C.

(57) ABSTRACT

The present invention discloses a wide band optical amplifier with a common mid-stage device. In the wide band optical amplifier according to the present invention, the signals that enter the amplifier are first split into a couple of sub-band signals. The sub-band signals are amplified independently at different optical amplification sections, but they share a common mid-stage device, which reduces the complexity and the cost of the amplifier. The sub-band signals propagate count-directionally in the common mid-stages device to reduce the nonlinear interactions between the signals in different sub-bands. A wide band optical amplifier incorporating a common mid-stage device with directionality is also disclosed.

14 Claims, 2 Drawing Sheets

WIDE BAND OPTICAL AMPLIFIER

BACKGROUND OF THE INVENTION

1. Field of the Invention

The present invention relates generally to the field of optical fiber communication and in particular to the optical amplifier.

2. Description of the Related Art

The optical amplifiers are widely used in wavelength-division multiplexed (WDM) optical communication systems and networks. In such systems and networks, the available transmission band for WDM channels depends mainly on the characteristics of the optical amplifiers. It is desirable the optical amplifiers to have wider bandwidth to increase the capacities of the WDM systems and the WDM networks. Thus there have been many efforts to implement wide band optical amplifiers.

FIG. 1 shows an example of conventional wide band optical amplifier proposed in a paper of S. Aisawa, T. Sakamoto, M. Fukui, J. Kani, M. Jinno, and K. Oguchi, Ultra-wideband, long distance WDM demonstration of 1 b/s (50×20 Gbit/s), 600 km transmission using 1550 and 1580 nm wavelength bands, Electron. Lett., vol. 34, no. 11, pp. 1127, 1998. The optical amplifier of FIG. 1 is realized by combining two braches of muti-stage optical amplifier sections in parallel. The signals that entered the amplifier through the input port (P1) are first split into two sub-band signals (C-band and L-band signals) by a wavelength-division multiplexer (WDM). The C-band signals enter the upper branch section, whereas the L-band signals the lower branch section. The upper branch section is composed of two erbium-doped fiber amplifiers (EDFAs) and a mid-state device comprising a gain equaling filter (GEQ) and a dispersion-compensating fiber (DCF). The lower branch section is composed of two gain-shifted erbium-doped fiber amplifiers (GS-EDFAs) and a mid-state device. The outputs of both the braches are combined by the other wavelength-division multiplexer (WDM) after passing through optical attenuators (ATTs). The amplifier output signals come out through the output port (P2) of the wavelength-division multiplexer (WDM).

The optical amplifier of FIG. 1 offers a wide bandwidth more than 60 nm in total. However, wide band optical amplifiers with parallel configurations like the optical amplifier described in FIG. 1 are relatively complex and costly since both the branches require their own mid-stage device.

SUMMARY OF THE INVENTION

The present invention is contrived in order to solve the above-mentioned problem. It is an object of the present invention to provide a multi-stage wide band optical amplifier. Wherein, (1) the signals that enter the amplifier are split into a couple of sub-band signals and each sub-band signals are amplified independently at different amplification sections. (2) The sub-band signals share a common mid-stage device to reduce the complexity and the cost.

In order to meet the above object, the present invention comprises an optical splitter section, two optical pre-amplification sections, two optical routers, a common mid-stage device, two boost-amplification sections, and an optical combiner section. The common mid-stage device comprises one or more of follows, optical filters for flattening the gain response of the optical amplifiers and suppressing the accumulation the amplifier noise, optical attenuators, and dispersion compensators for compensating for the chromatic dispersion of the optical fibers.

DETAILED DESCRIPTION OF THE EMBODIMENTS

Hereinafter, preferred embodiments of the present invention will be described in detail with reference to the accompanying drawings.

Figure 1:
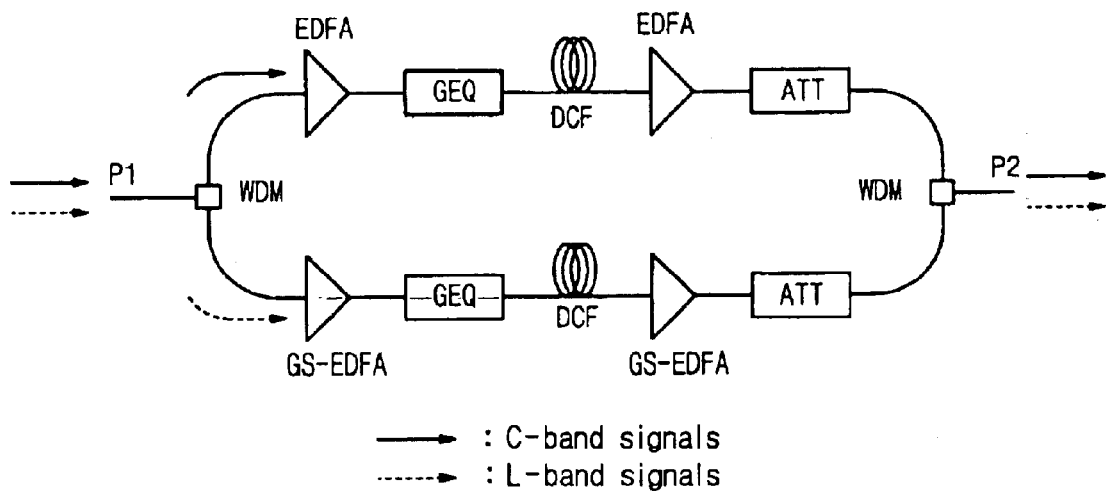
FIG. 1 illustrates a conventional wide band optical amplifier.
Figure 2:
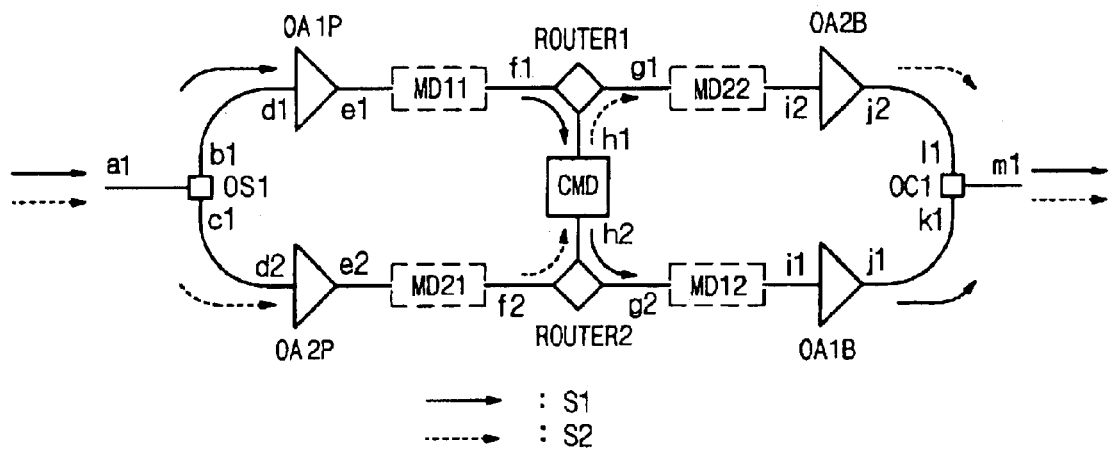
FIG. 2 is the schematic diagram of the wide band optical amplifier according to the first embodiment of the present invention.

The first embodiment of the wide band optical amplifier according to the present invention is described in FIG. 2.

The first embodiment of the wide band optical amplifier according to the present invention comprises an optical splitter section (OS1), two optical pre-amplification sections (OA1P, OA2P), two optical routers (ROUTER1, ROUTER2), a common mid-stage device (CMD), two boost-amplification sections (OA1B, OA2B), and an optical combiner section (OC1).

Each section of the wide band optical amplifier is examined in detail as follows: (1) An optical splitter section (OS1) having an input port (a1) and two output ports (b1 and c1) splits the optical signals that enter the section into a couple of sub-band signals (S1 and S2). (2) Two optical pre-amplification sections (OA1P, OA1P) have an input port (d1 or d2) an output port (e1 or e2) and one of the optical pre-amplification sections (OA1P) amplifies one of the sub-band signals (S1), whereas the other optical pre-amplification section (OA2P) amplifies the other sub-band signal (S2). (3) Two optical routers (ROUTER1, ROUTER2) have an input (f1 or f2), an output port (g1 or g2), and a common port (h1 or h2) and one of the optical routers (ROUTER1) routes the one of the sub-band signals (S1) from the input port (f1) to the common port (h1) and the other sub-band signal (S2) from the common port (h1) to the output port (g1), whereas the other optical router (ROUTER2) routes one of the sub-band signals (S2) from the input port (f2) to the common port (h2) and the other sub-band signal (S1) from the common port (h2) to the output port (g2). (4) Two optical boost-amplification sections (OA1B, OA1B) have an input port (i1 or i2) and an output port (j1 or j2), and one of the optical boost-amplification section (OA1B) amplifies one of the sub-band signals (S1), whereas the other optical boost-amplification section (OA2B) amplifies the other sub-band signal (S2). (6) An optical combiner section (OC1) having two input ports (k1 and l1) and an output port (m1) combines the sub-band signals (S1 and S2) that enter the section.

The connections among the sections and the device are as follows: (1) The output ports (b1 and c1) of the optical splitter section (OS1) are connected to the input ports (d1 and d2) of the pre-amplification sections (OA1P and OA2P), respectively. (2) The output ports (e1 and e2) of the pre-amplification sections (OA1P and OA2P) are connected to the input ports (f1 and f2) of the optical routers (ROUTER1 and ROUTER2), respectively. (3) The common ports (h1 and h2) of the optical routers (ROUTER1 and ROUTER2)

are connected to the both end of the common mid-stage device (CMD). (4) The output ports (g1 and g2) of the optical routers (ROUTER1 and ROUTER2) are connected to the input ports (i2 and i1) of the boost-amplification sections (OA2B and OA1B), respectively. (5) The output ports (j1 or j2) of the boost-amplification sections (OA1B and OA2B) are connected to the input ports (k1 and l1) of the optical combiner section (OC1), respectively.

The optical amplification section (OA1P, OA2P, OA1B, OA2B) is one of the followings; semiconductor optical amplifier, rare-earth element (such as Er, Pr, Tm) doped optical fiber amplifier, and optical fiber Raman amplifier.

The optical splitter section (OS1) and the optical combiner sections (OC1) are wavelength-division multiplexers.

The optical router (ROUTER1, ROUTER2) is one of the followings: a wavelength-division multiplexer and optical circulator.

The common mid-stage (CMD) comprises one or more of follows, optical filters for flattening the gain response of the optical amplifiers or suppressing the accumulation the amplifier noise, optical attenuators, and dispersion compensators for compensating the chromatic dispersion of the optical fibers.

The operation principle of the first embodiment of the wide band optical amplifier according to the present invention is as follows.

The signals that enter the wide band optical amplifier through the input port (a1) of the optical splitter section (OS1) are first split into two sub-band signals (S1 and S2) by the optical splitter section (OS1). One of the sub-band signals (S1) is amplified at one of the optical pre-amplification sections (OA1P) and enters the common mid-stage device (CMD) after passing though one of the optical routers (ROUTER1). The other sub-band signal (S2) is amplified at the other optical pre-amplification sections (OA2P) and enters the common mid-stage device (CMD) after passing though the other optical routers (ROUTER2). The sub-bands signals (S1 and S2) pass through the common mid-stage device (CMD) in opposite and enter the optical routers (ROUTER2 and ROUTER1), respectively. Then the signals (S1 and S2) are amplified at the boost-amplification sections (OA1B and OA2B), respectively, and combined by the optical combiner section (OC1). The output of the wide band optical amplifier comes out though the output port (m1) of the optical combiner section (OC1).

As mentioned above, two sub-band signals (S1 and S2) share the common mid-stage device (CMD) in the first embodiment of the present invention in order to reduce the complexity and the cost. However, the nonlinear interaction between the signals in different sub-bands is negligible since they propagate in opposite direction each other in the common mid-stage device (CMD).

The wide band optical amplifier according to the first embodiment of the present invention can further comprise one or more of the following mid-stage devices: a mid-stage device (MD11) which is connected between the output port (e1) of the optical pre-amplification section (OA1P) and the input port (f1) of the router (ROUTER1); a mid-stage device (MD21) which is connected between the output port (e2) of the optical pre-amplification section (OA2P) and the input port (f2) of the router (ROUTER2); a mid-stage device (MD12) which is connected between the output port (g2) of the router (ROUTER2) and the input port (i1) of the optical boost-amplification section (OA1B); and a mid-stage device (MD22) which is connected between the output (g1) of the router (ROUTER1) and the input port (i2) of the optical boost-amplification section (OA2B).

Each of the mid-stage device (MD11, MD21, MD12, MD22) comprises one or more of follows, optical filters for flattening the gain response of the optical amplifiers and suppressing the accumulation the amplifier noise, optical attenuators, and dispersion compensators for compensating the chromatic dispersion of the optical fibers.

One of the sub-band signals (S1) pass though only two mid-stage devices (MD11 and MD12), whereas the other sub-band signal (S2) pass through the other two mid-stage devices (MD21, MD22). Thus we can control the amplifier characteristics of each sub-band independently by using the additional mid-stage devices (MD11, MD21, MD12, MD22).

Figure 3:
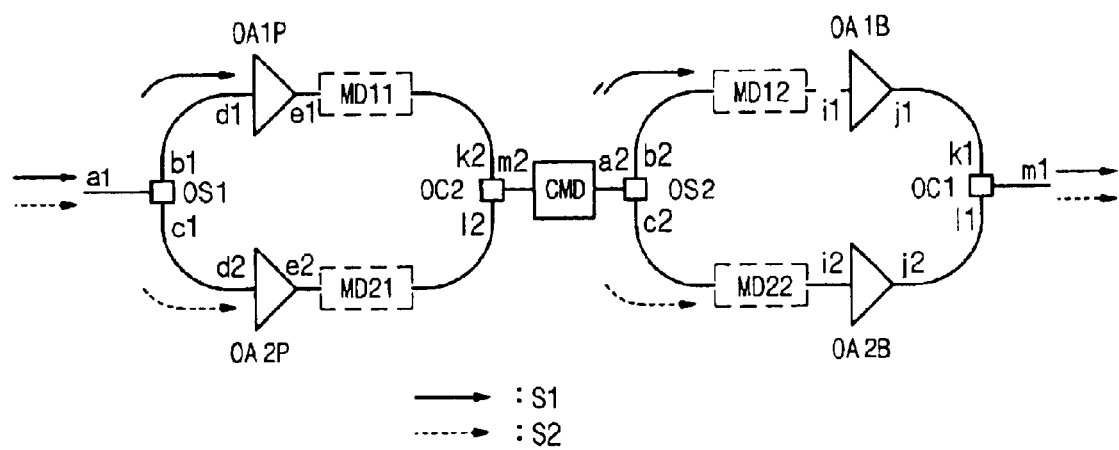
FIG. 3 is the schematic diagram of the wide band optical amplifier according to the second embodiment of the present invention.

The second embodiment of the wide band optical amplifier according to the present invention is described in FIG. 3. Unlikely, the first second embodiment described in FIG. 2 the second embodiment of the wide band optical amplifier described in FIG. 3 can be realized by using a unidirectional as well as a bidirectional common mid-stage device (CMD).

The second embodiment of the wide band optical amplifier according to the present invention comprises two optical splitter section (OS1, OS2), two optical pre-amplification sections (OA1P, OA2P), two optical combiner section (OC1, OC2), a common mid-stage device (CMD), and two optical boost-amplification sections (OA1B, OA2B).

Each section of the wide band optical amplifier is examined in detail as follows: (1) two optical splitter sections (OS1, OS2) having an input port (a1 or a2) and two output ports (b1 and c1 or b2 and c2) split the optical signals that enter the section into a couple of sub-band signals (S1 and S2). (2) Two optical pre-amplification sections (OA1P, OA1P) have an input port (d1 or d2) an output port (e1 or e2) and one of the optical pre-amplification sections (OA1P) amplifies one of the sub-band signals (S1), whereas the other optical pre-amplification section (OA2P) amplifies the other sub-band signals (S2). (3) Two optical combiner section (OC1, OC2) having two input ports (k1 and l1 or k2 and l2) and an output port (m1 or m2) combine the sub-band signals (S1 and S2) that enter the section. (4) Two optical boost-amplification sections (OA1B, OA1B) have an input port (i1 or i2) an output port (j1 or j2) and one of the optical pre-amplification sections (OA1B) amplifies one of the sub-band signals (S1), whereas the other optical pre-amplification section (OA2B) amplifies the other sub-band signals (S2).

The connections among the sections and the device are as follows: (1) The output ports (b1 and c1) of the splitter section (OS1) are connected to the input ports (d1 and d2) of the pre-amplification sections (OA1P and OA2P), respectively. (2) The output ports (e1 and e2) of the pre-amplification sections (OA1P and OA2P) are connected to the input ports (k2 and l2) of the optical combiner section (OC2), respectively. (3) The output port (m2) of the optical combiner section (OC2) is connected one end of the common mid-stage device (CMD). (4) The input port (a2) of the optical splitter section (OS2) is connected to the other end of the common mid-stage device (CMD). (5) The output ports (b2 and c2) of the optical splitter section (OS2) are connected to the input ports (i1 and i2) of the optical boost-amplification sections (OA1B and OA2B), respectively. (6) The output ports (j1 or j2) of the boost-amplification sections (OA1B and OA2B) are connected to the input ports (k1 and l1) of the optical combiner section (OC1), respectively.

The optical amplification section (OA1P, OA2P, OA1B, OA2B) is one of the followings; semiconductor optical amplifier, rare-earth element (such as Er, Pr, Tm) doped optical fiber amplifier, and optical fiber Raman amplifier.

The optical splitter sections (OS1, OS2) and the optical combiner sections (OC1, OC2) are wavelength-division multiplexers.

The common mid-stage (CMD) comprises one or more of follows, optical filters for flattening the gain response of the optical amplifiers or suppressing the accumulation the amplifier noise, optical attenuators, and dispersion compensators for compensating the chromatic dispersion of the optical fibers.

The operation principle of the second embodiment of the wide band optical amplifier according to the present invention is as follows.

The signals that enter the wide band optical amplifier through the input port (a1) of the optical splitter section (OS1) are split into two sub-band signals (S1 and S2) by the optical splitter section (OS1). One of the sub-band signals (S1) is amplified at one of the optical pre-amplification sections (OA1P), whereas the other sub-band signal (S2) is amplified at the other optical pre-amplification sections (OA2P). The outputs of the two pre-amplification sections (OA1P, OA2P) are combined by the optical combiner section (OC2) and pass through the common mid-stage device (CMD). Then the signals are split again into two sub-band signals (S1 and S2) by the optical splitter section (OS2) and the sub-band signals (S1 and S2) amplified independently at the boost-amplification sections (OA1B and OA2B), respectively. The outputs of the boost-amplification sections (OA1B and OA2B) are combined by the optical combiner section (OC1) and come out though the output port (m1) of the optical combiner section (OC1).

In the second embodiment of the present invention, two sub-band signals (S1 and S2) share the common mid-stage device (CMD) to reduce the complexity and the cost.

The wide band optical amplifier according to the first embodiment of the present invention can further comprise one or more of the following mid-stage devices:

The wide band optical amplifier according to the second embodiment of the present invention can also further comprises one or more of the following mid-stage devices: a mid-stage device (MD11) which is connected between the output port (e1) of the optical pre-amplification section (OA1P) and the input port (k2) of the optical combiner section (OC2); a mid-stage device (MD21) which is connected between the output port (e2) of the optical pre-amplification section (OA2P) and the input port (l2) of the optical combiner section (OC2); a mid-stage device (MD12) which is connected between the output (b2) of the optical splitter section (OS2) and the input port (i1) of the optical boost-amplification section (OA1B); and a mid-stage device (MD22) which is connected between the output (c2) of the optical splitter section (OS2) and the input port (i2) of the optical boost-amplification section (OA2B).

Each of the mid-stage device (MD11, MD21, MD12, MD22) comprises one or more of follows, optical filters for flattening the gain response of the optical amplifiers and suppressing the accumulation the amplifier noise, optical attenuators, and dispersion compensators for compensating the chromatic dispersion of the optical fibers.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. A wide band optical amplifier comprising:
an optical splitter section (OS1) with an input port (a1) and two output ports (b1 and c1) for splitting the optical signals that enter the section into a couple of sub-band signals (S1 and S2);

two optical pre-amplification sections (QA1P, OA2P) with an input port (d1 or d2) an output port (e1 or e2) for amplifying the sub-band signals (S1 and S2), respectively;

two optical routers (ROUTER1, ROUTER2) with an input (f1 or f2), an output port (g1 or g2), and an common port (h1 or h2) for routing the signals entering the input port (f1 or f2) into the common port (h1 or h2) and the signals entering the common port (h1 or h2) into the output port (g1 or g2);

a common mid-stage device (CMD) shared by the sub-band signals (S1, S2);

two optical boost-amplification sections (QA1B, OA2B) with an input port (i1 or i2) and an output port (j1 or j2) for amplifying the sub-band signals (S1 and S2), respectively; and, an optical combiner section (OC1) with two input ports (k1 and l1) and an output port (m1) for combining the sub-band signals (S1 and S2) that the enter the section, and wherein, the output ports (b1 and c1) of the optical splitter section (OS1) are connected to the input ports (d1 and d2) of the pre-amplification sections (QA1P and OA2P), respectively;

the output ports (e1 and e2) of the pre-amplification sections (QA1P and OA2P) are connected to the input ports (f1 and f2) of the optical routers (ROUTER1 and ROUTER2), respectively:

the common ports (h1 and h2) of the routers (ROUTER1 and ROUTER2) are connected to the both end of the common mid-stage device (CMD), respectively;

the output ports (g1 and g2) of the optical routers (ROUTER1 and ROUTER2) are connected to the input ports (i2 and i1) of the boost-amplification sections (OA2B and QA1B), respectively;

the output ports (j1 or j2) of the boost-amplification sections (QA1B and OA2B) are connected to the input ports (k1 and l1) of the optical combiner section (OC1), respectively.

2. A wide band optical amplifier as claimed in claim 1 wherein the optical amplifier further comprising one or more of the following mid-stage devices (MD11, MD21, MD12, MD22);

a mid-stage device (MD11) connected between the output port (e1) of the optical pre-amplification section (OA1P) and the input port (f1) of the router (ROUTER1);

a mid-stage device (MD21) connected between the output port (e2) of the optical pre-amplification section (OA2P) and the input port (f2) of the router (ROUTER2);

a mid-stage device (MD12) connected between the output (g2) of the router (ROUTER2) and the input port (i1) of the optical boost-amplification section (OA1B) and a mid-stage device (MD22) connected between the output (g1) of the router (ROUTER1) and the input port (i2) of the optical boost-amplification section (OA2B).

3. A wide band optical amplifier comprising:

two optical splitter section (OS1, OS2) with an input port (a1 or a2) and two output ports (bi and ci or b2 and c2) for splitting the signals that enter the section into a couple of sub-band signals (S1 and S2);

two optical pre-amplification sections (OA1P, OA2P) with an input port (d1 or d2) and an output port (e1 or e2) for amplifying the sub-band signals (S1 and S2), respectively;

two optical combiner section (OC1, OC2) with two input port (k1 and I1 or k2 or I2) and an output port (m1 or m2) for combining the sub-band signals (S1 and S2) that the enter the section;

a common mid-stage section (CMD), shared by the sub-band signals (S1, S2), which is a device selected from the group consisting of:
  filter which flats gains of optical amplifier;
  filter which reduce noises of optical amplifier;
  chromatic dispersion means which compensates chromatic dispersions of optical fibers; and
  combinations thereof; and two optical boost-amplification sections (QA1B, OA2B) with an input port (i1 or i2) and an output port (i1 or j2) for amplifying the sub-band signals (S1 and S2), respectively, and wherein, the output ports (b1 and c1) of the optical splitter section (OS1) are connected to the input ports (d1 and d2) of the pre-amplification sections (QA1P and OA2P) respectively;

the output ports (e1 and e2) of the pre-amplification sections (QA1P and OA2P) are connected to the input ports (k2 and I2) of the optical combiner section (OC2), respectively;

the output port (m2) of the optical combiner section (OC2) is connected one end of the common mid-stage device (CMD);

the input port (a2) of the optical splitter section (OS2) connected to the other end of the common mid-stage device (CMD);

the output ports (b2 and c2) of the optical splitter section (OS2) are connected to the input ports (i1 and i2) of the optical boost-amplification sections (QA1B and OA2B), respectively;

the output ports (j1 or j2) of the boost-amplification sections (OA1B and OA2B) are connected to the input ports (k1 and I1) of the optical combiner section (OC1), respectively.

4. An wide band optical amplifier as claimed in claim 3 wherein the optical amplifier further comprising one or more of the following mid-stage devices (MD11, MD21, MD12, MD22);

a mid-stage device (MD11) connected between the output port (e1) of the optical pre-amplification section (OA1P) and the input port (k2) of the optical combiner section (OC2);

a mid-stage device (MD21) connected between the output port (e2) of the optical pre-amplification section (OA2P) and the input port (I2) of the optical combiner section (OC2);

a mid-stage device (MD12) connected between the output (b2) of the optical splitter section (OS2) and the input port (i1) of the optical boost-amplification section (OA1B); and a mid-stage device (MD22) connected between the output (c2) of the optical splitter section (OS2) and the input port (i2) of the optical boost-amplification section (OA2B).

5. A wide band optical amplifier as claimed in claim 1, or claim 2,
  wherein the optical splitter section (OS1 or OS2) or the optical combiner section (OC1 or OC2) is a wavelength-division multiplexer.

6. A wide band optical amplifier as claimed in claim 1, or claim 2, wherein the optical router (ROUTER1 or ROUTER2) is a wavelength-division multiplexer.

7. A wide band optical amplifier as claimed in claim 1 or claim 2, wherein the optical router (ROUTER1 or ROUTER2) is an optical circulator.

8. A wide band optical amplifier as claimed in claim 1, or claim 2,
  wherein the optical pre-amplification section (QA1P or OA2P) or optical boost-amplification section (QA1B or OA2B) is one of the followings; a semiconductor optical amplifier, a rare-earth doped optical fiber amplifier, and an optical fiber Raman amplifier.

9. An optical amplifier as claimed in claim 2
  wherein the common mid-stage device (CMD) comprises one or more of followings; an optical filter, an optical attenuator, and a dispersion compensator.

10. An optical amplifier as claimed in claim 2
  wherein the mid-stage device (MD11, MD12, MD21, or MD22) comprises one or more of followings; an optical filter, an optical attenuator, and a dispersion compensator.

11. A wide band optical amplifier as claimed in claim 3,
  wherein the optical splitter section (OS1 or OS2) or the optical combiner section (OC1 or OC2) is a wavelength-division multiplexer.

12. A wide band optical amplifier as claimed in claim 3,
  wherein the optical pre-amplification section (QA1P or OA2P) or optical boost-amplification section (OA1B or OA2B) is one of the followings; a semiconductor optical amplifier, a rare-earth doped optical fiber amplifier, and an optical fiber Raman amplifier.

13. An optical amplifier as claimed in claim 3,
  wherein the common mid-stage device (CMD) comprises one or more of followings; an optical filter, an optical attenuator, and a dispersion compensator.

14. An optical amplifier as claimed in claim 3,
  wherein the mid-stage device (MD11, MD12, MD21, or MD22) comprises one or more of followings; an optical filter, an optical attenuator, and a dispersion compensator.

* * * * *